US006238526B1

(12) United States Patent
Maishev et al.

(10) Patent No.: US 6,238,526 B1
(45) Date of Patent: May 29, 2001

(54) ION-BEAM SOURCE WITH CHANNELING SPUTTERABLE TARGETS AND A METHOD FOR CHANNELED SPUTTERING

(75) Inventors: Yuri Maishev, Moscow (RU); James Ritter, Fremont, CA (US); Leonid Velikov; Alexander Shkolnik, both of San Carlos, CA (US)

(73) Assignee: Advanced Ion Technology, Inc.

( * ) Notice: Subject to any disclaimer, the term of this patent is extended or adjusted under 35 U.S.C. 154(b) by 0 days.

(21) Appl. No.: 09/249,681

(22) Filed: Feb. 14, 1999

(51) Int. Cl.$^7$ ............................ C23C 14/00; C23C 14/32
(52) U.S. Cl. .................. 204/192.11; 204/298.04; 204/298.26; 204/298.21; 204/298.18; 204/298.17; 204/298.22; 204/298.12; 204/298.14; 204/298.07
(58) Field of Search .................. 204/298.04, 192.11, 204/298.26, 298.21, 298.18, 298.17, 298.22, 298.12, 298.14, 298.07

(56) References Cited

U.S. PATENT DOCUMENTS

| 3,494,852 | * | 2/1970 | Doctoroff | 204/298.04 |
| 4,415,427 | * | 11/1983 | Hidler et al. | 204/298.26 |
| 5,069,770 | * | 12/1991 | Glocker | 204/298.21 |
| 5,334,302 | * | 8/1994 | Kubo et al. | 204/298.26 |

FOREIGN PATENT DOCUMENTS

| 2030807 | * | 10/1995 | (RU) | H01J/27/04 |

OTHER PUBLICATIONS

Brian Chapman: Glow Discharge Processes (Sputtering and Plasma Etching), John Willey & Sons, NY, 1980, p. 272.

* cited by examiner

*Primary Examiner*—Nam Nguyen
*Assistant Examiner*—Daborah Chacko-Davis
(74) *Attorney, Agent, or Firm*—Ilya Zborovsky, Agent (57) ABSTRACT

The invention provides a sputtering system which consists of an ion beam and a target of a sputterable material. A distinguishing feature of the system of the invention is that the sputtering target forms a guide channel for an ion beam and sputtered particles, so that a portion of the ions collides with the walls of the target inside a closed volume of the target and forms neutral sputterable particles impinging the object. The other part of the ions goes directly to the object and participates in an ion-assisted overcoating. Thus, the special form of the target improves efficiency of sputtering, prevents scattering and the loss of the sputterable material. The system can be realized in various embodiments. One of the embodiments provides a multiple-cell system in which each cell has an individual ion-emitting slit formed by the end of a cathode rod of one cathode plate and the opening in the second cathode plate. Tubular or plate-like channeling targets are connected to the ion slits without any gaps in the form of a geometrical extensions of the individual ion-emitting slits. Another embodiment allows adjustment in the position of the rods with respect to the targets.

31 Claims, 8 Drawing Sheets

ION-BEAM SOURCE WITH CHANNELING SPUTTERABLE TARGETS AND A METHOD FOR CHANNELED SPUTTERING

FIELD OF THE INVENTION

The present invention relates to the field of ion-emission technique, particularly to an ion source with a channeling sputterable targets for sputtering the material of the target practically without any loss of sputtered particles. The invention also relates to a method for channeled sputtering.

BACKGROUND OF THE INVENTION AND DESCRIPTION OF THE PRIOR ART

An ion source is a device that ionizes gas molecules and then focuses, accelerates, and emits them as a narrow beam. This beam is then used for various technical and technological purposes such as cleaning, activation, polishing, thin-film coating, or etching. An ion source is also used for overcoating of various objects by sputtering. Sputtering is a phenomenon that occur when energetic ionized particles, emitted, e.g., from an ion source, impinge on the surface of a solid or liquid target, causing the emission of particles and erosion of the surface of the solid. The sputtered target particles can appear as charged or neutral atoms or molecules, atom clusters, or chunks. The controlled deposition of sputtered particles to form thin films and coatings has industrial application in electronics, optics, and corrosion and wear-resistant coatings.

In a simplest form an ion-beam sputtering system consists of a sealed vacuum chamber that contains an ion-beam source, a target of a sputterable material, and an object to be treated. The target is installed at angle to the direction of the ion beam emitted by the ion source so that at the point of collision with the surface of the target the beam knocks-out or sputters particles of the target material which fly away from the surface of the target. A part of the sputtered particles deposited onto the surface of the treated object. Such a system is described by Brian Chapman in: Glow Discharge Processes (Sputtering and Plasma Etching), John Willey & Sons, New York, 1980, p. 272).

A disadvantage of the ion-beam sputtering system of the type described above is that a significant part of the particles is scattered away from the object and contaminates the inner walls of the chamber and the surfaces of the ion-beam source.

Attempts have been made to reduce scattering and loss of the sputtered particles in the ion-beam sputtering systems described in U.S. Pat. No. 6,130,507 issued on Oct. 10, 2000 to Yu. Maishev et al. now U.S. Pat. No. 6,130,507 and entitled "Cold-Cathode Ion Source with Propagation of Ions in the Electron Drift Plane".

Figure 1:
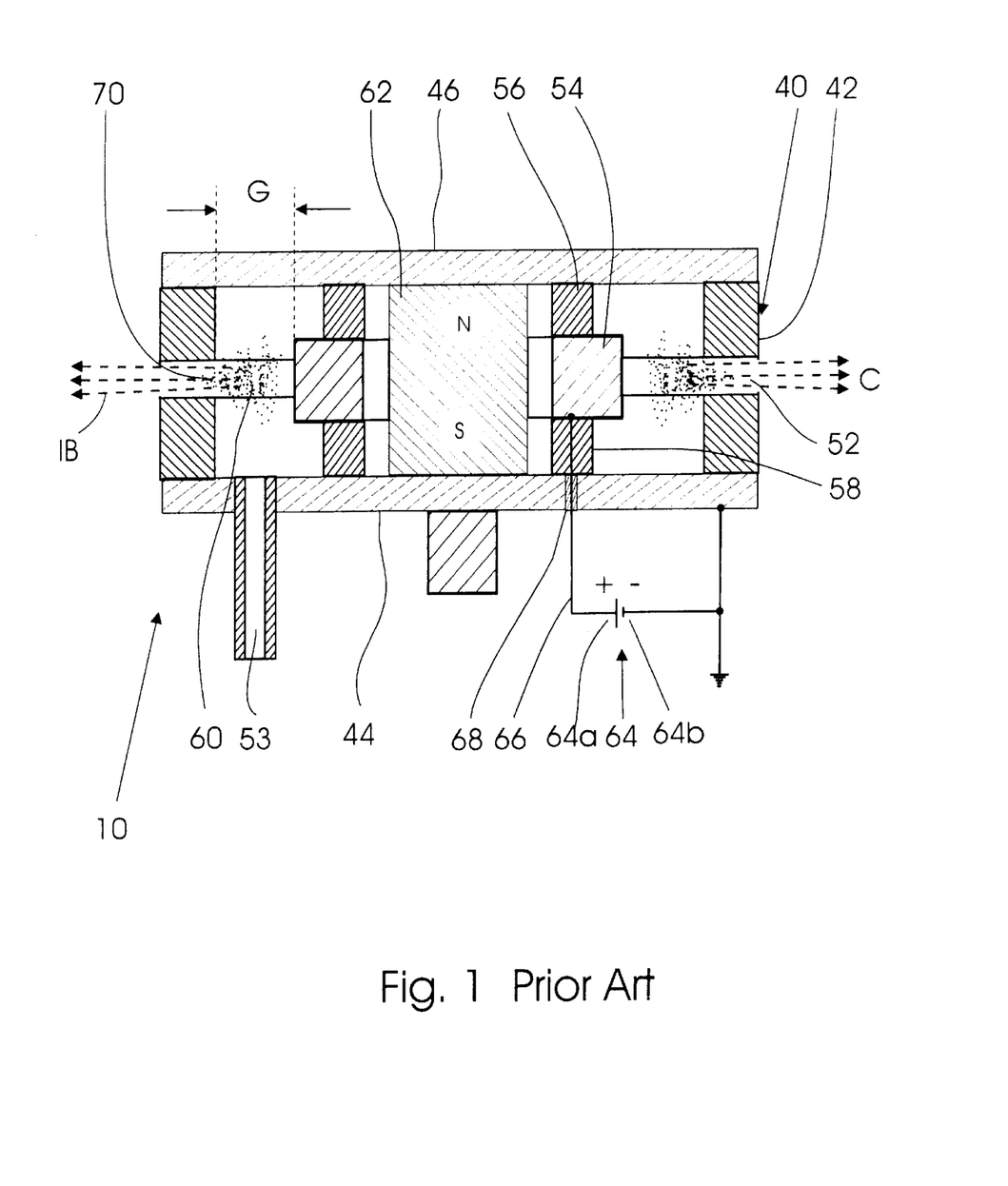
FIG. 1 is a sectional side view of a known ion-beam source with a circular ion-emitting slit having direction of emission of ions coinciding with the plane of drift of electrons.

Since the ion source is an essential part of the system, given below is a detail description of a closed-loop ion source 10 of the invention which is shown in a cross-sectional view in FIG. 1. This source is used for emitting ion beams in a radial outward direction in a plane of drift of electrons. In a transverse cross-section (not shown), ion source 10, as well as its appropriate parts such as a cathode, anode, and magnet, may have a circular, oval, or elliptical cross section. It is understood that, strictly speaking, oval or ellipse do not have a radial direction and that the word "radial" is applicable to a circle only. However, for the sake of convenience, here and hereinafter, including patent claims, the terms "radially inwardly" and "radially outwardly" will be used in connection with any closed-loop configuration of the ion-emitting slit from which the ion beams are emitted inwardly or outwardly perpendicular to the circumference of the ion-beam housing.

Ion source 10 has a hollow housing 40 made of a magnetoconductive material which is used as a cathode. Housing 40 has a closed flat bottom 44 and a flat top side 46 with a through closed-loop ion-emitting slit 52 formed in the side wall of housing 40 around its entire periphery, approximately in the middle of the height of the source housing.

A working gas supply hole 53 is also formed in the side wall of housing 40.

Hollow housing or cathode 40 contains a similarly-shaped concentric anode 54 which is fixed inside the housing by means of appropriately shaped bodies 56 and 58 of a nonmagnetic dielectric material, such as ceramic. Anode 54 is spaced from the inner walls of cathode 40 at a radial distance G required to form an ionization space 60. In the direction of the height of housing 40, anode 54 is aligned with the position of closed-loop slit 52.

A magnetic-field generation means, which in this embodiment is shown as a permanent magnet 62, is located inside anode 54 and is spaced from the inner surface of the anode. As shown in FIG. 1, magnet 62 is concentric to anode 54 and housing 40 and also has an oval-shaped configuration. It is understood that upper and lower parts 46 and 44 as well as adjacent parts of housing 40, which form ion-emitting slit 52, should be electrically connected. This is achieved by making magnet 62 of a conductive material, e.g., such as SmCo alloy. Alternatively, when an electromagnet is used, these parts may be connected via conductors (not shown).

Anode 54 is electrically connected to a positive pole 64a of an electric power supply unit 64 by a conductor line 66 which passes into housing 40 via a conventional electric feedthrough 68. Cathode 40 is electrically connected to a negative pole 64b of power supply unit 64.

In operation (FIG. 1), vacuum chamber or object OB (not shown) is evacuated, and a working gas is fed into the interior of housing 40 of ion source 10 via inlet opening 53. A magnetic field is generated by permanent magnet 62 in ionization gap G between anode 54 and cathode 40, whereby electrons begin to drift in a closed path within the crossed electrical and magnetic fields. In the case of the device of the invention, the electrons begin to drift in gap G between anode 54 and cathode 40 and in ion-emitting slit 52 in the same plane in which the ions are emitted from the slit.

A plasma 70 is formed between anode 54 and cathode 40 and partially inside ion-emitting slit 52. When the working gas is passed through ionization and acceleration gap G, ion beam IB, which propagates outwardly in the direction shown by arrows C, is formed in the area of ion-emitting slit 52 and in accelerating gap G between anode 54 and cathode 40.

The above description of the electron drift is simplified to ease understanding of the principle of the invention. In reality, the phenomenon of generation of ions in the ion source with a closed-loop drift of electrons in crossed electric and magnetic fields is of a more complicated nature and consists in the following.

When, at starting the ion source, a voltage between anode 54 and cathode 40 reaches a predetermined level, a gas discharge occurs in anode-cathode gap G. As a result, the electrons, which have been generated as a result of ionization, begin to migrate towards anode 54. After being accelerated by the electric field, the ions pass through ion-emitting slit 52 and are emitted from the ion source. Inside the ion-emitting slit, the crossed electric and magnetic fields force the electrons to move along closed cycloid trajectories. This phenomenon is known as "magnetization" of electrons. The magnetized electrons remain drifting in a closed space between two parts of the cathode, i.e., between those facing parts of cathode 40 which form ion-emitting slit 52. The radius of the cycloid is, in fact, the so-called doubled Larmor radius $R_L$ which is represented by the following formula:

$$R_L = mcV/|e|B,$$

where m is a mass of the electron, B is the strength of the magnetic field inside the slit, V is a velocity of the electrons in the direction perpendicular to the direction of the magnetic field, and $|e|$ is the charge of the electron.

It is required that the height of the electron drifting space in the ion-emission direction be much greater than the aforementioned Larmor radius. This means that a part of the ionization area penetrates into ion-emitting slit 52 where electrons can be maintained in a drifting state over a long period of time. In other words, a spatial charge of high density is formed in ion-emitting slit 52.

When a working medium, such as argon which has neutral molecules, is injected into the slit, the molecules are ionized by the electrons present in this slit and are accelerated by the electric field. As a result, the ions are emitted from the slit towards the object. Since the spatial charge has high density, an ion beam of high density is formed. This beam can be converged or diverged by known technique for specific applications.

Figure 2:
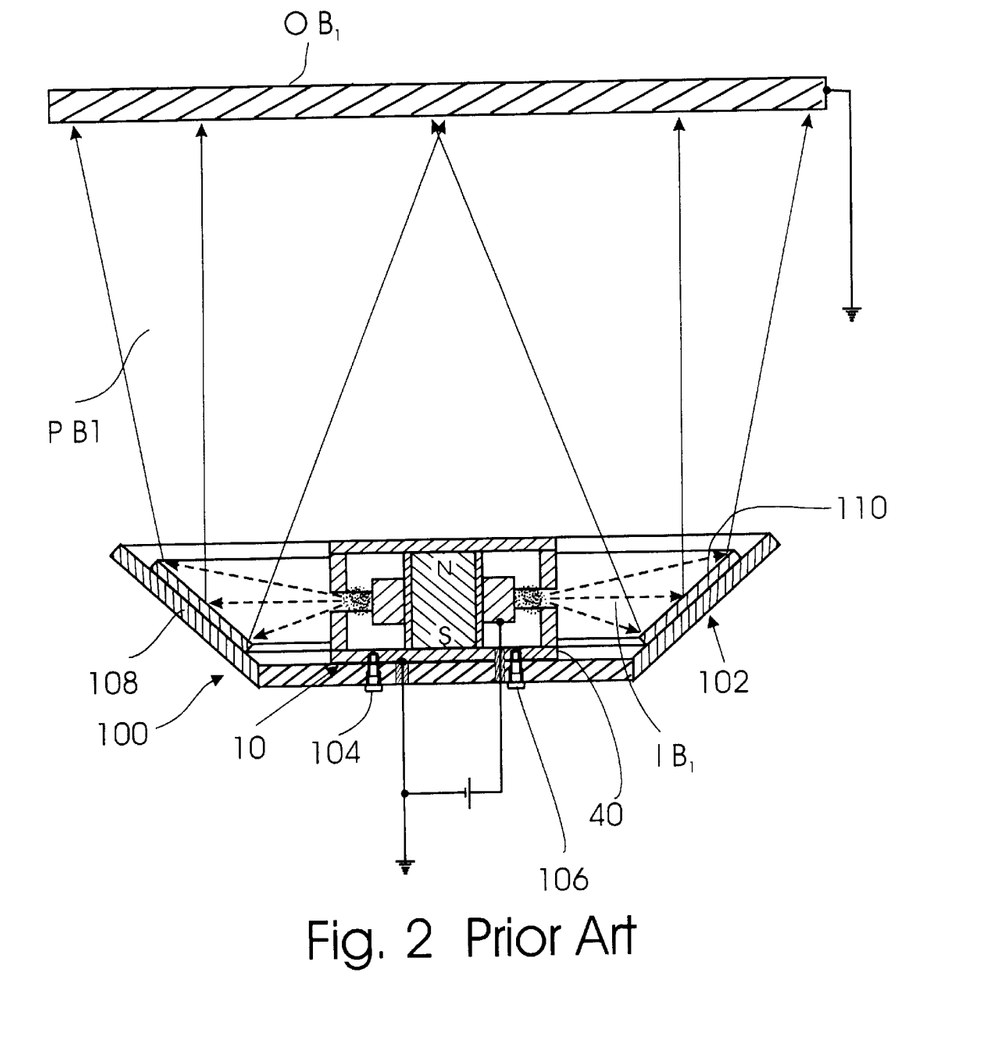
FIG. 2 is a sectional view of a sputtering system consisting of an ion-beam source of FIG. 1 and a sputterable target.

FIG. 2 illustrates an example of a sputtering system which consists of ion-beam source 10 and a target holder 100 with a target 110. Target holder 100 is rigidly supported by housing 40 of ion source 10. Target holder 100 is made in the form of a plate 102 attached to housing 40, e.g., by bolts 104, 106, with a funnel-shaped peripheral portion 108 which has an upwardly directed larger diameter portion. The inner taper surface of target holder 100 supports a target 110 which has a shape of a truncated cone. The target is attached to peripheral portion 108 of holder 100, e.g., by gluing or by bolts (not shown), and is made of a material, such as cobalt, which has to be deposited onto an object $OB_1$ by sputtering.

Since ion beam $IB_1$ is emitted from a closed-loop emitting slit 52 of ion source 10 in a radial outward direction, continuously over the entire periphery of the ion source, and since the plane of target 110 is inclined to the direction of incident beam $IB_1$ (the angle of attack of the ion beam should be different from 90°), the beam sputters particles of the target, in accordance with conventional sputtering technique, and deposits them onto the surface of object $OB_1$ in the form of a converging or diverging beam of sputtered particles. The convergence or divergence of the sputtering beam depends on the taper angle of the target and the position of the object with respect to the ion source.

As shown in FIG. 2 sputtering beam PB1 covers the entire surface of object $OB_1$ so that this surface can be coated with a thin uniform layer of the target material.

In order to improve uniformity of deposition of sputtered particles onto object $OB_1$, the target 110 can be attached to a moveable target holder (not shown) that performs rotating or swinging motions, or the ion beam can be scanned over the surface of the target. Such mechanisms are shown in the aforementioned early patent application.

It is understood that the entire source-target system and an object to be treated are placed into a sealed vacuum chamber (not shown).

Although the use of plate-like conical targets of the type shown in FIG. 2, as well as the use of movable targets and target scanning ion beams, can to some extent control and reduce scattering of sputtered particles, they cannot prevent scattering completely.

Thus, a common disadvantage of the aforementioned sputtering systems, as well as of any other known sputtering system, is that they do not exclude deposition of at least a fraction of sputtered particles onto surfaces other than the object, e.g., onto the inner walls of the vacuum chamber, surfaces of the ion-beam source, etc. In other words, the known sputtering systems cannot provide directed deposition of sputtered particles essentially only onto the object or prevent some scattering of the deposition material away from the object. The known ion-beam sputtering systems of the aforementioned type do not allow formation of a neutral beam that may be effectively used for overcoating in processes where treatment with ion beams is undesirable. They do not allow adjustment in a ratio of ions to atoms of the deposition material that reach the surface of the object.

OBJECTS OF THE INVENTION

It is an object of the present invention to provide a sputtering system, which practically completely prevents loss of the deposition material, which is essential in depositing precious and rare materials, allows treatment of dielectric sufaces with a neutral beam and reduction of the charge on the dielectric surfaces with a neutral beam, allows ion-assisited overcoating with an ion beam simultaneously with the deposition process, allows combination of various materials in the aforementioned directional deposition, and makes it possible to adjust a ratio of ions to atoms of the deposition material that reach the surface of the object and a ratio of sputtered particles to process-assisting ions.

SUMMARY OF THE INVENTION

The invention provides a sputtering system which consists of an ion beam and a target of a sputterable material. A distinguishing feature of the system of the invention is that the sputtering target forms a guide channel for an ion beam and sputtered particles, so that a portion of the ions collides with the walls of the target inside a closed volume of the target and forms neutral sputterable particles impinging the object. The other part of the ions goes directly to the object and participate in an ion-assisted overcoating. Thus, the special form of the target improves efficiency of sputtering, prevents scattering and the loss of the sputterable material. The system can be realized in various embodiments. One of the embodiments provides a multiple-cell system in which each cell has an individual ion-emitting slit formed by the end of a cathode rod of one cathode plate and the opening in the second cathode plate. Tubular or plate-like channeling targets are connected to the ion slits without any gaps in the form of geometrical extensions of the individual ion-emitting slits. Another embodiment allows adjustment in the position of the rods with respect to the targets.

DETAILED DESCRIPTION OF THE INVENTION

Figure 3:
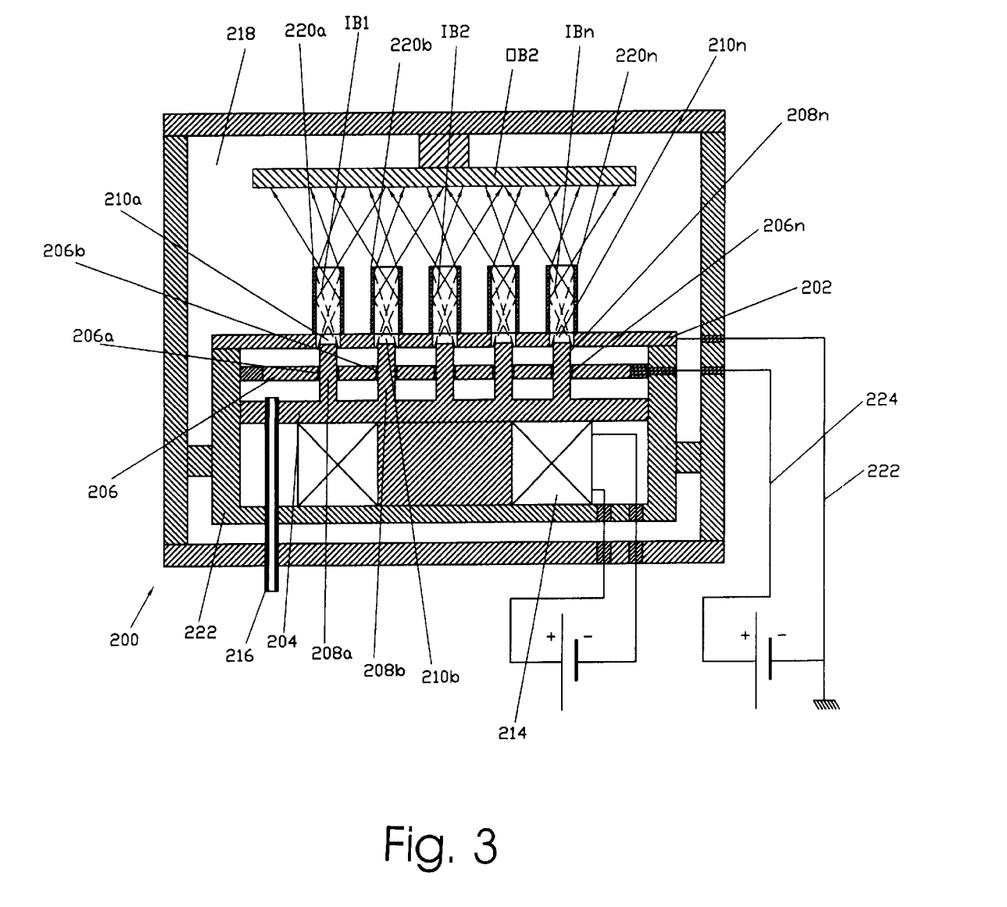
FIG. 3 is a sectional side view of a sputtering system of the present invention with an ion source of the type shown in FIG. 1 with a plurality of ion-emitting slits and with tubular channeling targets.

As shown in FIG. 3, which is an elevational sectional view of the ion-beam sputtering system 200 of the present invention, the ion source of the system is made in the form of a multiple-cell source having two cathode plates 202 and 204 which function as magnetic poles. An anode plate 206 with openings 206a, 206b . . . 206n is placed between cathode plates 202 and 204. Cathode plate 204 has rods 208a, 208b, . . . 208n, which extend from cathode plate 204 to second cathode plate 202. Second cathode plate 202 has openings 210a, 210b, . . . 210n coaxial with respective rods 208a, 208b, . . . 208n and with openings in anode plate 206. The anode-cathode assembly is supported by a cup-shaped housing 222 of a nonconductive material, such as a ceramic, which contains an electromagnetic coil 214 for generating the aforementioned magnetic field in a anode-cathode space of ion source 200. In a conventional manner, entire ion source 200 is placed into a sealed vacuum chamber 218. A working-medium is supplied to vacuum chamber 218 via a working medium supply channel 216.

Depending on the required ion-optical properties of the ion beam, rods 208a, 208b, . . . 208n can be made of a magnetic or nonmagnetic material.

Thus, each opening 210a, 210b, . . . 210n in cathode plate 202 and a respective coaxial rod 208a, 208b . . . 208n of the device form an individual ion-beam source of the type described above, i.e., of the type disclosed in Russian Patent No. 2,030,807. More specifically, the end of each rod and the adjacent opening in cathode plate 202 form a closed-loop ion-emitting slit, so that all rods and the openings in the second cathode plate form a plurality of such slits. In the context of the present invention, a combination of one rod with a respective opening will be referred to as a "cell", and the ion-beam source of this type will be called a "multiple-cell type ion-beam source". Cathode plates 202 and 204 are electrically isolated from anode plate 206 and can be grounded or connected to a source of a negative potential via a conductor 222, and anode plate 206 is connected to a source of a positive potential (not shown) via a conductor 224.

Figure 3A:
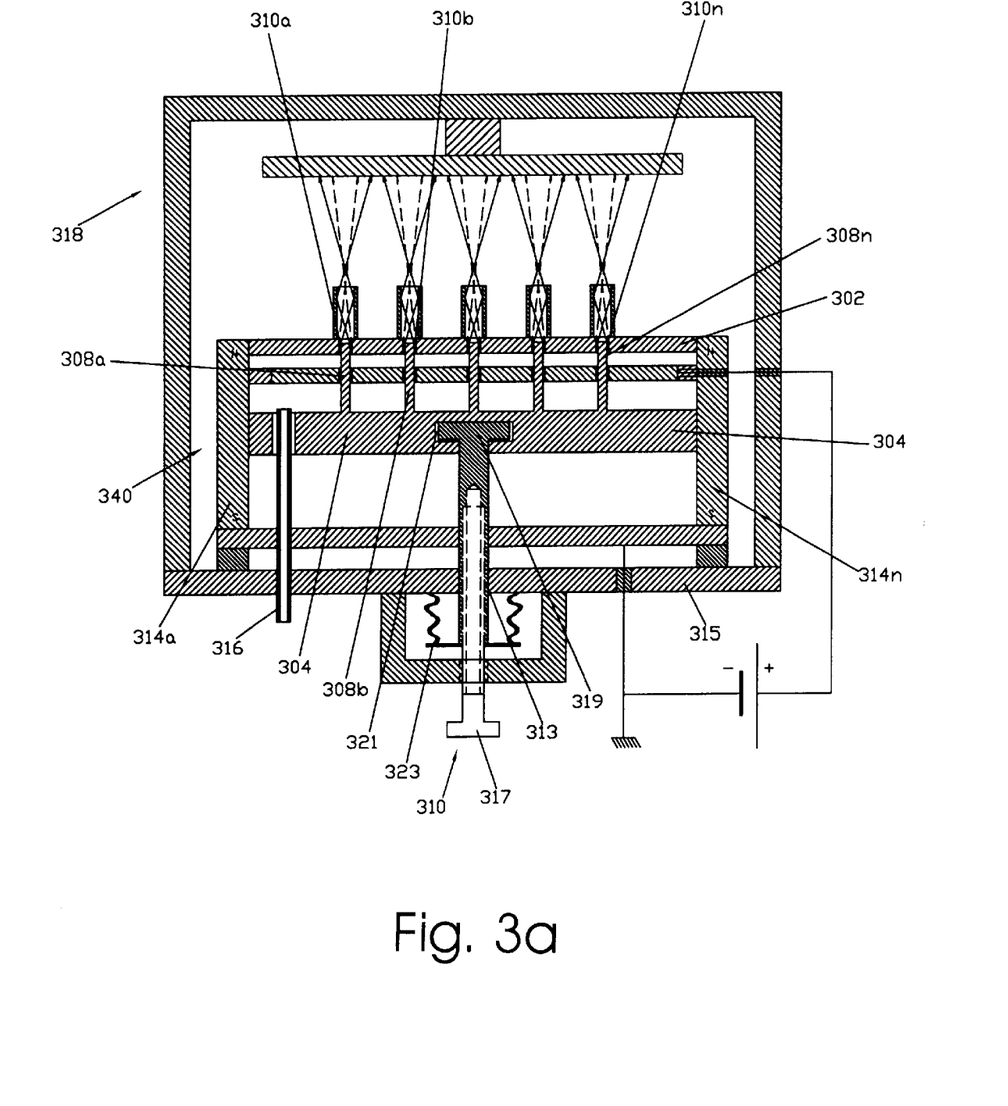
FIG. 3a is a sectional side view of the sputtering system of FIG. 3 with a mechanism for adjusting positions of cathode rods with respect to sputterable targets.

If necessary, as shown in FIG. 3A, the unit consisting of lower cathode plate 304 with rods 308a, 308b, . . . 308n can be moveable with respect to housing 340 of the ion source for adjusting position of the ends of rods 308a, 308b, . . . 308n with respect to openings 310a, 310b, . . . 310n in cathode plate 302. This is achieved by means of an adjustment screw 311 which has a thread portion 313 engageable with the inner thread in the bottom portion of housing 315 of vacuum chamber 318. On the side projecting to the outside of chamber 318, screw 313 has a handle 317, whereas the opposite end of the screw has a disk-like portion 319 rotationally installed in a recess 321 of lower cathode plate 304. It is understood that screw 311 passes to the outside of vacuum chamber 318 via a feedthrough mechanism 323 which allows transmission of a rotary motion to the parts inside vacuum chambers without violation of sealed conditions of the chamber. Such feedthrough devices are produced by Huntington Mechanical Laboratory in Mountain View, Calif. A working gas supply tube 316 and inner walls of housing 340 function as guides for the moveable unit consisting of lower plate 304 with rods 308a, 308b . . . 308c. In the embodiment of FIG. 3a, magnets 314a, . . . 314n (only two of which are shown) are circumferentially arranged around the cathode-anode assembly. The remaining parts of the system are the same as in FIG. 3.

In operation, a working medium is supplied through channel 216 to the accelerating and ion-generating space between anode plate 206 and cathode plates 202, 204, and a potential difference is developed between the cathode plates and the anode plate. This generates crossed electric and magnetic fields in the anode-cathode space. These fields hold drifting electrons which ionize the working medium and compensate for the spatial charge of the ion beams IB1, IB2, IBn, which are emitted toward an object OB2 via openings in the second cathode plate.

The part of the sputtering system of the present invention described so far is known. The following is a description of a novel and distinguishing feature of the system of the invention that imparts to it capacities unattainable with the use of known sputtering systems. This feature is a group of unique sputtering targets having a channeling effect on the ions and particles of the sputterable material.

More specifically, in the embodiment of FIG. 3 the sputtering system is formed by a plurality of tubular targets 220a, 220b, . . . 220n made of a sputterable material, e.g., such as conductive materials, e.g., molybdenum, tungsten, tantalum, chromium, nickel, copper, aluminum, different alloys, graphite, or dielectrics such as aluminum oxide, silicon oxide, etc. These tubular targets are connected to cathode plate 202 without any gap directly so that they form geometrical extensions of openings 210a, 210b, . . . 210n in cathode plate 202. As a result, tubular targets 220a, 220b, 220n produce channeling effect on the ions emitted toward the inner walls of these targets.

Now the operation of the sputtering system of FIG. 3 will be described in parallel with the explanation of the term "channeling" in the context of the present invention. When diverging ion beams $IB_1$, $IB_2$, . . . $IB_n$ are emitted by the ion-beam source 100 through respective ion-emitting slits formed by openings 210a, 210b, . . . $210_n$ in cathode plate 202 in combination with the ends of rods 208a, 208b, . . . 208n of individual cells and genter the respective tubular targets 220a, 220b, . . . 220n, the ions of the beams bombard the inner walls of targets 220a, 220b, . . . 220n and knock-out neutral atoms of the sputterable material of the tubes. A portion of these neutral atoms moves toward an object $OB_2$ and precipitates on it. The trajectories of such atoms are shown in FIG. 3 by sold-line arrows. Another part of the neural atoms precipitates on the inner walls of targets 220a, 220b, . . . 220n. Thus, the material of the target practically is not lost and is not scattered in the directions away from the object. Furthermore, portions of the ion beam may pass through tubular target 220a, 220b, . . . 220n without contact with the walls and bombard directly object $OB_1$. In FIG. 3, these ion beams are shown by dotted-line arrows. In other words, this portion of the beam produces ion-assisted film deposition.

Figure 4:
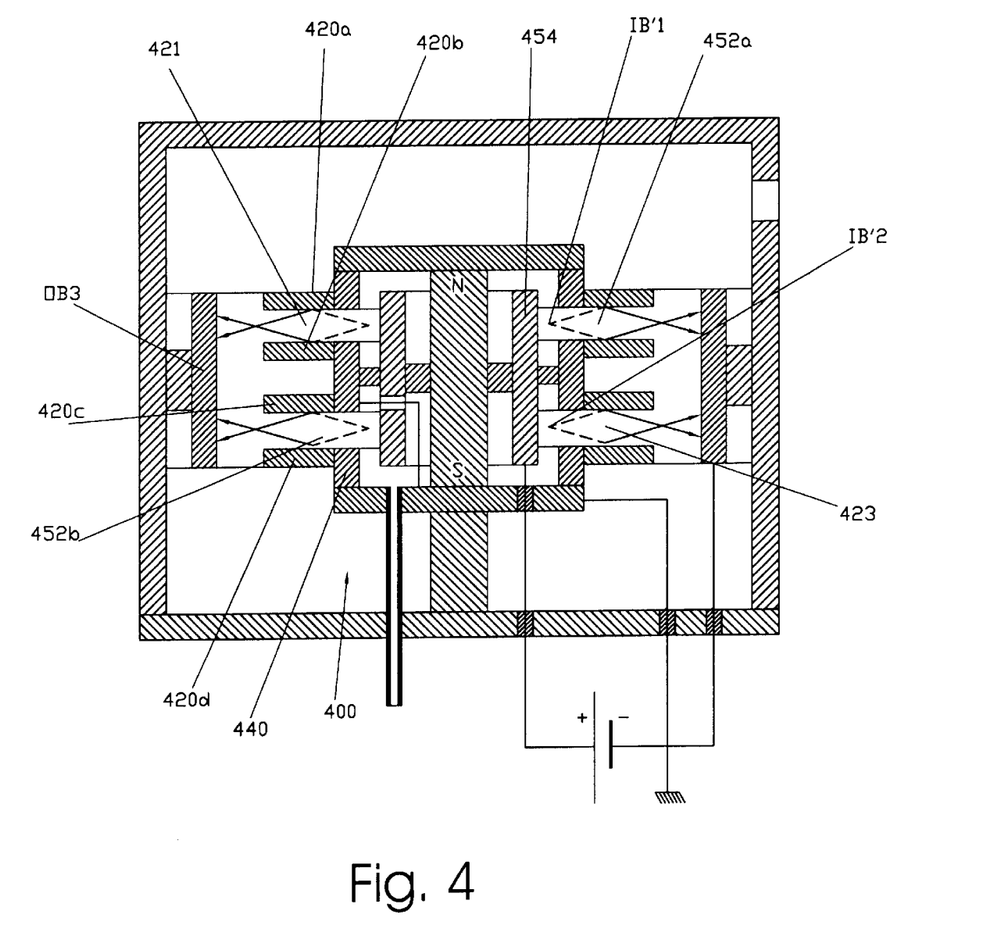
FIG. 4 is a sectional side view of a sputtering system of the present invention with channels formed by parallel disks in the plane parallel to the plane of drift of electrons.

Another embodiment of the invention is shown in FIG. 4 which is a sectional side view of a sputtering system with channels formed by parallel disks in the plane parallel to the plane of drift of electrons.

An ion-beam source 400 is essentially the same as ion source 10 with the exception that housing 440 has two ion-emitting slits 452a and 452b. Two slits are shown only for simplicity of the drawings, and it is understood that more than two slits can be used. Both slits operate with a common anode 454. The remaining units and parts of the ion source, such as magnets, a working gas supply tube, etc., are the same as in ion-beam source 10. Therefore the description of these parts and units is omitted. The embodiment of FIG. 4 differs from the embodiment of FIG. 3 by the construction of channeling means which in this case are formed by a plurality of target disks 420a, 420b, 420c, and 420d, which are parallel to the plane of drift of the electrons in ion-emitting slits 452a and 452b. In fact, a pair of disks 420a and 420b form an annular channel 421 which is an outward continuation of annular ion-emitting slit 452a. Similarly, a pair of disks 420c and 420d form an annular channel 423 which is an outward continuation of annular ion-emitting slit 452b. It is understood that disks 420a–420d are made of a sputterable material.

The sputtering system of FIG. 4 operates in the same manner as has been described with regard to tubular channeling targets 220a, 220b, . . . 220n, with the exception that ion beams IB'1, IB'2 . . . bombard the facing surfaces of disks, which form respective channels 421 and 423. Similarly to FIG. 3, in FIG. 4 solid-line arrows show trajectories of particles which have been knocked-out from the surfaces of the disks and deposited onto the surface of the object. The dotted-line arrows show ion-beams which pass through channels 421 and 423 without contacting the surfaces of the disks. The remaining elements of the ion source, such as the magnet, the working medium supply tube, etc., are the same as in the embodiment of FIG. 1. In this case, an object $OB_3$ is the tube, the inner surface of which is treated. The tube itself can be evacuated and used as a vacuum chamber.

Figure 5:
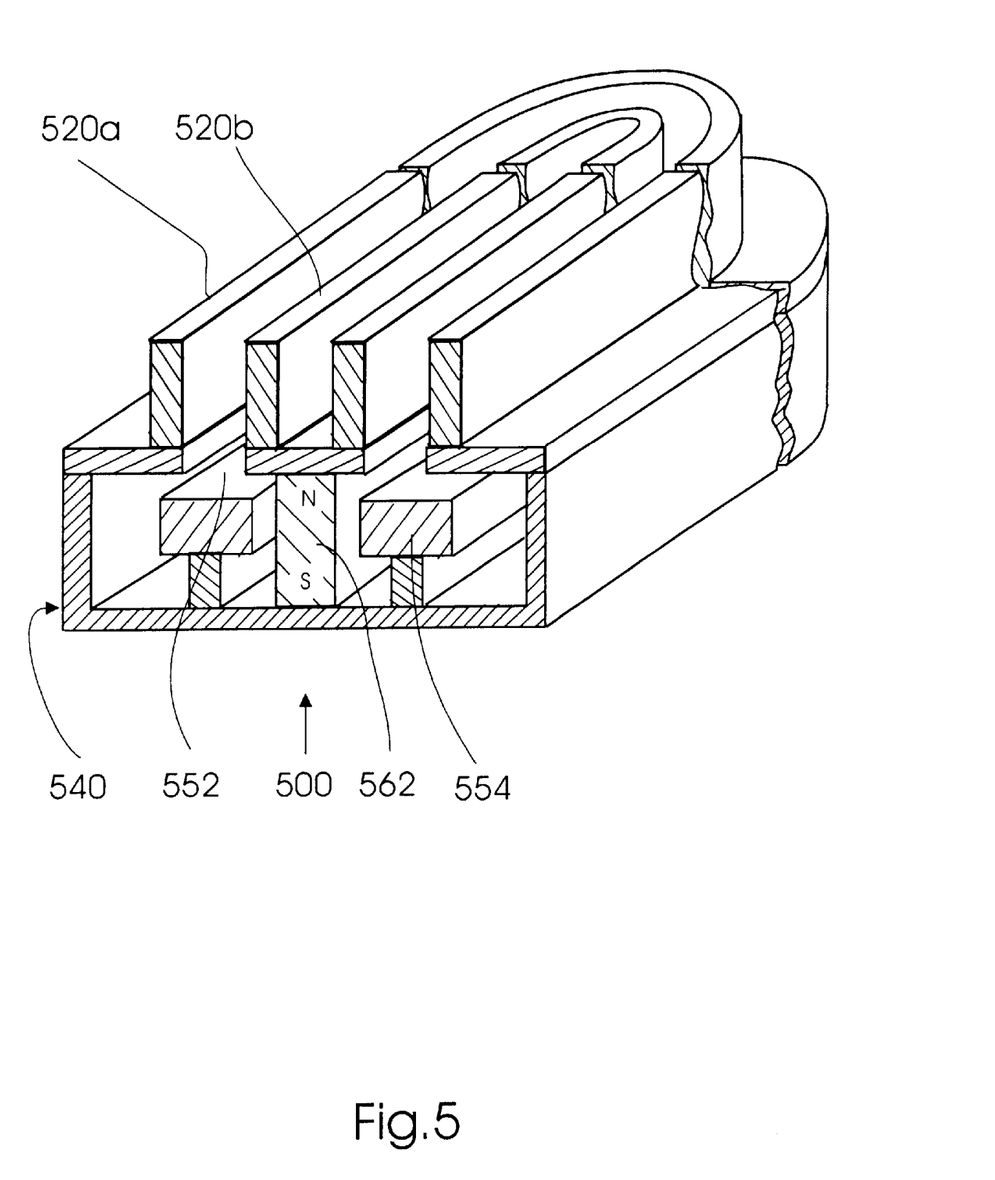
FIG. 5 is a three-dimensional partial view of a sputtering system of the invention with an ion source having direction of the ion beam perpendicular to the direction of drift of electrons, the channeling target being formed by two concentric closed-loop bodies.

Another embodiment of the invention is shown and described with reference to FIG. 5 which is a three-dimensional partial view of a sputtering system of the invention with an ion source having a direction of the ion beam perpendicular to the plane of drift of electrons. The construction of such an ion source is disclosed in aforementioned Russian Patent No. 2,030,807 issued in 1995 to M. Parfenyonok, et al. As shown in FIG. 5, an ion source 500 of this embodiment consists of a housing 540, which functions as a cathode, an anode 554, and a magnet 562. An ion-emitting slit 552 is formed in the upper plate of cathode 540 as a partially-shown oval-shaped closed loop. A channeling target is formed by two concentric closed-loop bodies 520a and 520b. Since the oval slit has long linear parts of the profile, these parts are similar essentially to two parallel plates on each side of slit 552.

Spaces between closed-loop bodies 520a and 520b function as aforementioned channels which are similar to channels 421 and 423 between disks 420a–420d of FIG. 4 with the difference that the channels are perpendicular to the plane of drift of the electrons.

Figure 6A:
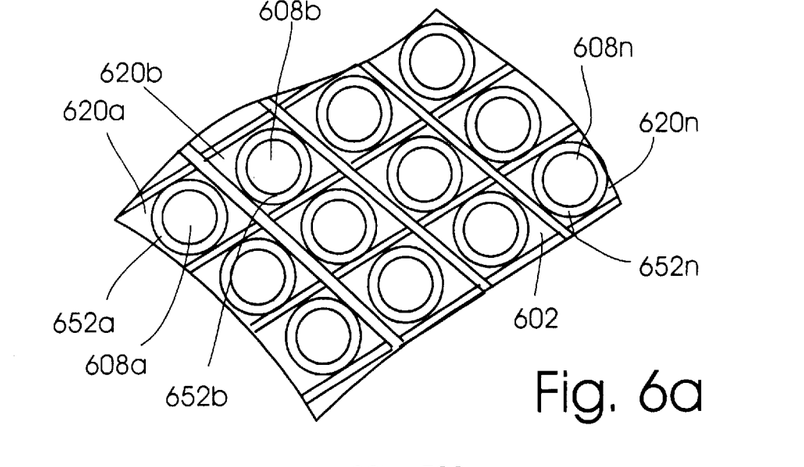
FIGS. 6a, 6b, and 6c are fragmental top views of multiple-cell channeling targets, which show various arrangements of cells in the sputtering system.
Figure 6B:
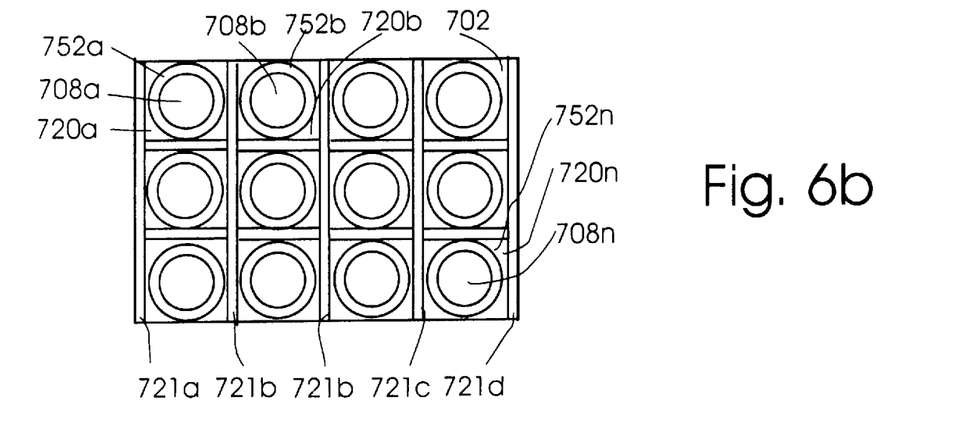
Figure 6C:
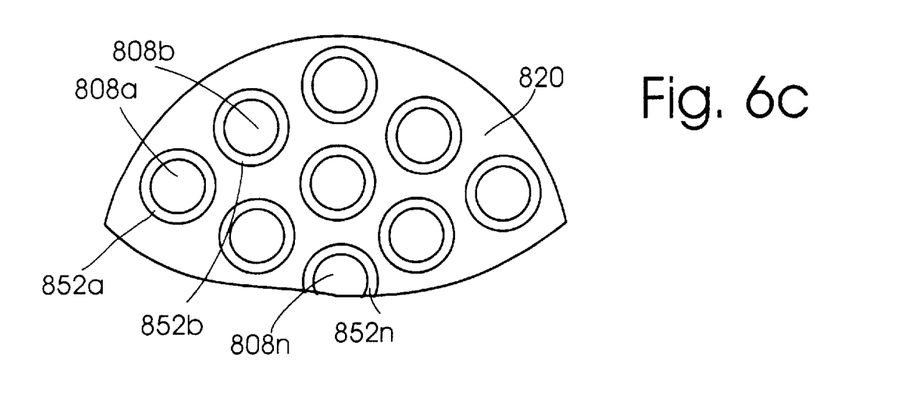

FIGS. 6a, 6b, and 6c are fragmental top views of multiple-cell channeling targets of the type suitable for use instead of tubular targets 220a, 220b, . . . .220n shown in FIG. 3.

FIG. 6a shows hexagonal arrangement of rhomboidal sputtering channels, FIG. 6b shows an orthogonal arrangement of square-sputtering channels, and FIG. 6c shows channels formed by holes in a plate-like target.

FIG. 6a shows rhomboidal tubular sputtering channels 620a, 620b, . . . 620n in a hexagonal arrangement. Reference numeral 608a, 608b, . . . 608n designate rods of the lower cathode plate (not shown). These rods form ion-emitting slits 652a, 652b, . . . 652n with the openings of cathode plate 602.

FIG. 6b shows square-shaped tubular sputtering channels 720a, 720b, . . . 720n in the orthogonal arrangement of cells. Reference numeral 708a, 708b, . . . 708n designate rods of the lower cathode plate. These rods form ion-emitting slits 752a, 752b, . . . 752n with the openings of cathode plate 702.

FIG. 6c shows channels formed by holes in a thick plate-like target 820. Reference numeral 808a, 808b, . . . 808n designate rods of the lower cathode plate. These rods form ion-emitting slits 852a, 852b, . . . 852n with the openings of cathode plate (not shown).

The multiple-ell structure of the target makes it possible not only to change the pattern of the cells, as shown in FIGS. 6a, 6b, 6c, but also to combine various materials in various combinations for simultaneous sputtering and for obtaining complex structures in the deposited films. This can be achieved, e.g., by alternating plates that form the cells. For example, in the structure shown in FIG. 6b, plates 721a and 721c can be made of copper, while plates 721b and 721d can be made of aluminum.

Figure 7:
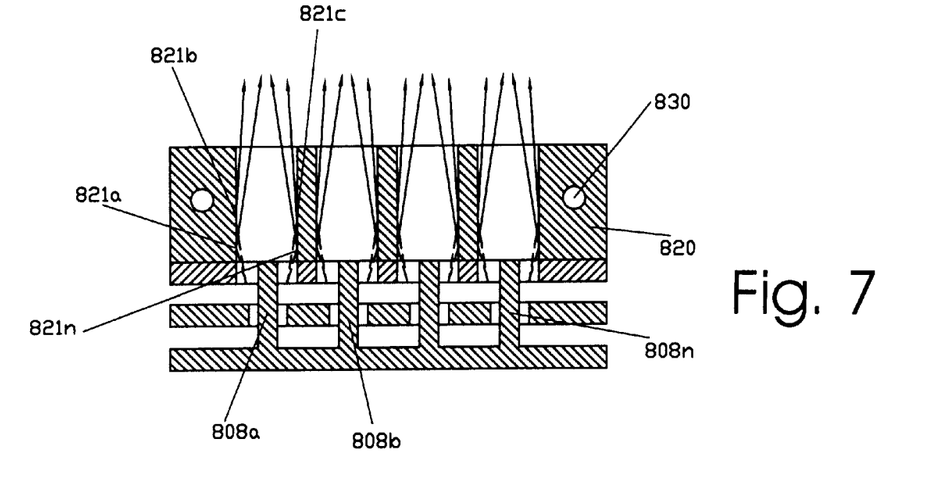
FIG. 7 is a fragmental side sectional view illustrating a relationship between channeling targets and cathode rods that provides uniform ion-assisted deposition of metals and/or dielectrics, reactive deposition, or generation of high-speed neutral particles.

FIG. 7 is a fragmental side sectional view illustrating a relationship between channeling targets and cathode rods that provide uniform ion-assisted deposition of metals and/or dielectrics, reactive deposition, or generation of high-speed neutral ions.

For convenience, the adjustment of a ratio of the quantity of ions that have passed through the channel directly to the object without collisional sputtering to the quantity of ions which have collided with the inner walls of the channels will be considered with reference to the embodiment of FIG. 6c. Hereinafter such a ratio will be referred to as an ion ratio. For understanding the principle of adjustment of the ion ratio it would be expedient to introduces the term "angular aperture of the sputterable target channel". The angular aperture can be defined as a ratio of a half of the diameter (or other transverse dimension) of the channel to the length of the channel. It is understood that the ion beam has a certain divergence. Depending on the geometry of the ion-emitting slit and the applied accelerating potential, the divergence can vary from several fractions of angular degree to tens of degrees. If the ion-beam divergence coincides with the angular aperture of the channel, practically all the ions of the ion beam will collide with the channel walls. If, on the contrary, the angular aperture of the channel is much greater than the ion-beam divergence, the major part of the ions will pass directly to the object without collision with the walls of the target. Thus, by shifting cathode rods 808a, 808b, ... 808n (FIGS. 6c and 7), e.g., by means of a screw 311 shown in FIG. 3a, it becomes possible to adjust the divergence, and hence, the ion ratio. The same effect can be achieved by changing the thickness of plate 820 (by replacing the plates). In FIG. 7, dots 821a, 821b, ... 821n are points of collision of the ion beams with the walls of the channels. Thick plate 820, which is used as a sputterable target, may require cooling. Such cooling means are shown in FIG. 7 in the form of channels 830 formed in the target for circulating water.

Figure 8:
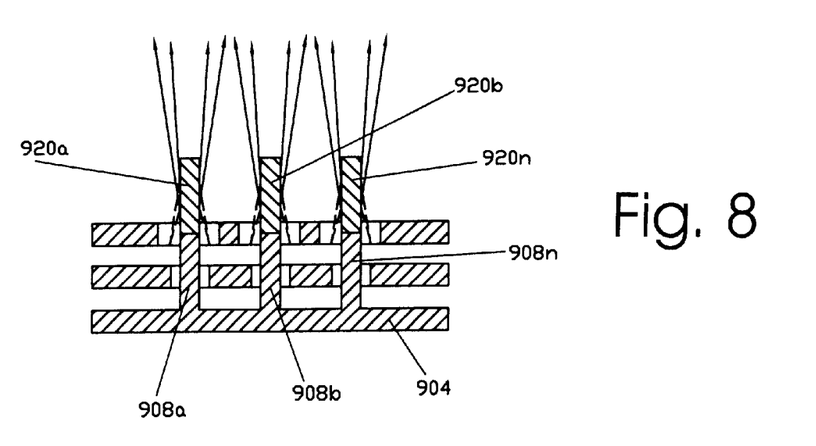
FIG. 8 illustrates an embodiment in which the sputterable channeling targets are formed by a plurality of rods which are formed as geometrical extensions of cathode rods of the cathode plate.

FIG. 8 illustrates an embodiment in which the sputterable channeling targets are formed by a plurality of rods 920a, 920b, 920n which are formed as extensions of cathode rods 908a, 908b, 908n of a lower cathode plate 904. In the position of sputterable channeling targets shown in FIG. 8 a slightly smaller amount of ions, as compared to the position of targets in FIG. 7, participate in collision with the target surface. It is known in the art that ion-beam sources are normally provided with means for cooling the anode-cathode system as well. However, for the simplicity of the drawings, the anode-cathode cooling systems are not shown.

Aforementioned adjustment of the ion ratio makes it possible to adjust the modes of operation of the ion source. For example, when the channel is long and a substantially all the ions collide with the target surface, the case corresponds to pure overcoating with the sputterable material. When the length of the of the channel is reduced, and the part of the ions passes directly to the object without collision with the target surface, it becomes possible to perform ion-assisted overcoating. When essentially all ion beams pass directly to the object, the case corresponds to pure etching, surface activation, etc.

Another advantage of the adjustable multiple-cell sputtering system of the invention is that it allows for obtaining rapid flows of neutral particles, which are essential for treating dielectric surfaces. When such surfaces are treated with ions, they accumulate undesirable charges. This problem is well known in semiconductor technology. By making the targets of the type proposed by the present invention from materials with a low coefficient of sputtering, e.g., from tungsten, molybdenum, etc., interacting with which the ions of an inert gas, e.g., of argon, loose the charge without the loss of kinetic energy, makes it possible to obtain neutral beams of the argon. By bombarding the surface of the dielectric with the neutral beam, it becomes possible to prevent accumulation of the charge on the dielectric surface.

Thus, it has been shown that the invention provides a sputtering system, which practically completely prevents loss of the deposition material, which is essential in depositing precious and rare materials, allows treatment of dielectric surfaces with a neutral beam and reduction of the charge on the dielectric surface with neutral beam, allows ion-assisted ovecoating with an ion beam simultaneously with the deposition process, allows combination of various materials in the aforementioned directional deposition, and makes it possible to adjust a ratio of ions to atoms of the deposition material that reach the surface of the object and a ratio of sputtered particles to process-assisting ions.

Although the invention has been shown and described with reference to specific embodiments, it is understood that these embodiments were given only as examples and that any changes and modifications are possible, provided they do not depart from the scope of the appended claims. For example, ion sources different from those shown and described in the specification and drawings can be used for the targeting systems of the invention. For example, this can be a linear or circular end-Hall source, a electron-cyclotron resonance type ion source, different types of gridded broad-beam ion sources, etc. The channeling targets may have shapes different from tubular or rectangular and can be produced from different materials. Performance characteristics of the process can be adjusted by changing the geometry and characteristics of the beams, as well as electrical parameters of the ion source. It is understood that various working media such as argon, oxygen, nitrogen, or their mixtures, etc., can be used.

What is claimed is:

1. A sputtering system for treating the surface of an object, comprising:
an ion-beam source having cathode means, anode means, electric field generating means, and at least one ion-emitting slit in said cathode means; and
channeling target means which constitute a geometrical extension of said at least one ion-emitting slit to form at least one channel for guiding a flow of sputtered particles and an ion beam directly onto at least part of the surface of said object, wherein said at least one ion-emitting slit is a closed-loop slit, and said channeling target means comprising at least one body is made of a sputterable material.

2. The sputtering system of claim 1, wherein said channeling target means comprise a pair of concentric bodies between which said channel is formed, said concentric bodies being made of a sputterable material.

3. The sputtering system of claim 2 wherein said ion-beam source is an ion-beam source of the type having electrons drifting in crossed electric and magnetic fields, said ion beam being emitted in the direction perpendicular to the plane of drift of the electrons, said channel being perpendicular to said plane of drift of the electrons.

4. The sputtering system of claim 3, wherein said ion-beam source has a plurality of ion-emitting slits, said ion-beam source being further provided with means for generating a magnetic field across said ion-emitting slits, said cathode means consisting of a first cathode plate having a plurality of openings and a second cathode plate having a plurality of projections extending toward said first cathode plate, said projections and said openings in said first cathode plate forming said plurality of ion-emitting slits, said anode means having a plurality of openings coaxial with said openings of said first cathode plate, said projections coaxially passing through said openings of said anode means, said channeling target means comprising a plurality of tubular bodies, said tubular bodies being geometrical extensions of said ion-emitting slits.

5. The sputtering system of claim 4, further comprising means for adjusting position of said projections with respect to said channeling target means in the axial direction of said projections.

6. The sputtering system of claim 4, wherein in a plan view of said first cathode plate said tubular bodies have a hexagonal arrangement.

7. The sputtering system of claim 4, wherein in a plan view of said first cathode plate said tubular bodies have an orthogonal arrangement.

8. The sputtering system of claim 3, wherein said ion-beam source has a plurality of ion-emitting slits, said ion-beam source being further provided with means for generating a magnetic field across said ion-emitting slits, said cathode means consisting of a first cathode plate having a plurality of openings and a second cathode plate having a plurality of projections extending toward said first cathode plate, said projections and said openings in said first cathode plate forming said plurality of ion-emitting slits, said anode means having a plurality of openings coaxial with openings of said first cathode plate, said projections coaxially passing through said openings of said anode means, said channeling target means comprising a plate with openings, said openings in said plate being geometrical extensions of said ion-emitting slits.

9. The sputtering system of claim 8, further comprising means for adjusting position of said projections with respect to said channeling target means in the axial direction of said projections.

10. The sputtering system of claim 8, wherein in a plan view of said plate said openings of said plate have a hexagonal arrangement.

11. The sputtering system of claim 8, wherein in a plan view of said plate said openings of said plate have an orthogonal arrangement.

12. The sputtering system of claim 8, wherein said channeling target means have cooling means.

13. The sputtering system of claim 3, wherein said ion-beam source has a plurality of ion-emitting slits, said ion-beam source being further provided with means for generating a magnetic field across said ion-emitting slits, said cathode means consisting of a first cathode plate having a plurality of openings and a second cathode plate having a plurality of projections extending toward said first cathode plate, said projections and said openings in said first cathode plate forming said plurality of ion-emitting slits, said anode means having a plurality of openings coaxial with said openings of said first cathode plate, said projections coaxially passing through said openings of said anode means, said channeling target means comprising rods of a sputterable material which are extensions of said projections.

14. The sputtering system of claim 13, further comprising means for adjusting position of said projections with respect to said channeling target means in the axial direction of said projections.

15. The sputtering system of claim 13, wherein in a plan view of said first cathode plate said rods have a hexagonal arrangement.

16. The sputtering system of claim 13, wherein in a plan view of said first cathode plate said rods have an orthogonal arrangement.

17. The sputtering system of claim 1, wherein said ion-beam source is an ion-beam source of the type having electrons drifting in crossed electric and magnetic fields, said ion beam being emitted radially outwardly in the plane of drift of the electrons, said channel being parallel to said plane of drift of the electrons.

18. The sputtering system of claim 17, wherein said ion-beam source has a plurality of ion-emitting slits and a plurality of said channels.

19. The sputtering system of claim 1, wherein said channeling target means have cooling means.

20. A method of treating the surface of an object by means of a system comprising a vacuum chamber, an ion-beam source located in said vacuum chamber and having at least one ion-emitting slit which is a closed-loop slit, sputterable target means, and means for the supply of a working medium to said ion-beam source, said method comprising:
providing said sputterable target means with channeling means which constitute a geometrical extension of said at least one ion-emitting slit to form at least one channel having walls made of a sputterable material;
activating said ion-beam source for generating an ion beam; and
guiding said ion beam through said channeling means directly toward the surface of said object.

21. The method of claim 20, wherein said ion beam is a diverging ion beam which has a divergence that ensures that one part of ions of said ion beam collides with said sputterable material and knocks-out neutral particles of said sputterable material which are directed toward said object for overcoating, and another part of ions is directed onto said object without collision with said sputterable material for ion-assisted treatment of said object.

22. The method of claim 21, further comprising the step of adjusting a ratio of the quantity of said ions that have passed through said channel directly to said object without collision with said sputterable material to the quantity of said ions which have collided with said sputterable material.

23. The method of claim 22, wherein said ratio is adjusted so that essentially all ions collide with said sputterable material to direct to said object only neutral particles.

24. The method of claim 23, wherein at least a part of said surface of said object is a dielectric surfaces, said method further comprising the step of treating said dielectric surface with said neutral particles for reducing the charge on said dielectric surface.

25. The method of claim 20, wherein said sputterable target means has a plurality of channels, said channels being made of different sputterable materials, said method comprising the step of overcoating said surface of said object with a composite deposition layer formed by combining said different sputterable materials.

26. A sputtering system for treating the surface of an object, comprising:
an ion-beam source comprising a first cathode plate with a plurality of first openings, a second cathode plate with a plurality of projections directed toward said first openings, an anode plate between said first cathode plate and said second cathode plate, said anode plate having a plurality of second openings, said projections passing through said second openings, said first openings and said projections forming a plurality of ion-emitting slits, said ion beam source having means for generating an electric field and means for generating a magnetic field, said electric and magnetic fields being crossed and passing through said ion-emitting slits to cause drift of electrons in said ion-emitting slits, said ion-beam source having means for the supply of a working medium to the space between said anode plate and said first cathode plate; and
channeling target means which constitute geometrical extensions of said ion-emitting slits to form a plurality of channels for guiding a flow of sputtered particles and ion beams directly onto at least part of the surface of said object.

27. The system of claim 26, wherein said channeling target means comprising a plurality of tubular bodies made of a sputterable material.

28. The system of claim 26, wherein said channeling target means comprise a plate with third openings which are coaxial with said first openings and are geometrical extensions thereof.

29. The system of claim 26, wherein said channeling target means comprise a plurality of rods of a sputterable material, said rods being extensions of said projections, pass through said first openings, and project through said first openings to form said channels.

30. The system of claim 26 further comprising means for adjusting positions of said projections with respect to said channeling target means.

31. A sputtering system for treating the inner surface of a tubular object, comprising:

an ion-beam source comprising a tubular cathode with at least one closed-loop ion-emitting slit in a side wall of said tubular cathode in a plane perpendicular to the longitudinal axis of said tubular cathode, a tubular anode inside said tubular cathode arranged concentrically thereto; a magnet inside said tubular anode for generating a magnetic field passing across said at least one closed-loop ion-emitting slit, electric power supply means for applying to said tubular anode a potential positive with respect to said tubular cathode for generating an electric field that crosses said magnetic field and passes through said at least one closed-loop ion-emitting slit; means for supplying a working medium to a space between said tubular anode and said tubular cathode for generating an ion beam emitted through said at least one closed-loop ion-emitting slit in the direction parallel to the plane of drift of electrons in said crossed electric and magnetic fields; and channeling target means comprising parallel plates of a sputterable material the facing sides of which form a geometrical extension of said at least one closed-loop ion-emitting slit.

\* \* \* \* \*